United States Patent [19]
Allenspach et al.

[11] Patent Number: 5,867,025
[45] Date of Patent: Feb. 2, 1999

[54] MAGNETORESISTIVE SPIN VALVE SENSOR WITH STEPPED LAYERS

[75] Inventors: Rolf Allenspach, Adliswil; Wolfgang F. Weber, Zurich, both of Switzerland

[73] Assignee: International Business Machines Corporation, Armonk, N.Y.

[21] Appl. No.: 836,841

[22] PCT Filed: Nov. 21, 1994

[86] PCT No.: PCT/EP94/03836

§ 371 Date: Jun. 13, 1997

§ 102(e) Date: Jun. 13, 1997

[87] PCT Pub. No.: WO96/16339

PCT Pub. Date: May 30, 1996

[51] Int. Cl.⁶ .............. G01R 33/09; H01F 1/00; H01L 43/00; G11B 5/39
[52] U.S. Cl. .............. 324/252; 338/32 R; 360/113; 428/611
[58] Field of Search .............. 324/252, 207.21, 324/235; 338/32 R; 360/113; 428/611

[56] References Cited

U.S. PATENT DOCUMENTS 5,680,091  10/1997  Maeda et al. .............. 338/32 R

*Primary Examiner*—Walter E. Snow
*Attorney, Agent, or Firm*—Steven B. Phillips; Gerald R. Woods

[57] ABSTRACT

A magnetoresistive spin valve sensor is described. Such a sensor is also known as a GMR sensor or giant magnetoresistive sensor. The layers (24, 26, 28) of the sensor are mounted on a substrate (20) having steps or terraces on one of its face. The steps or terraces on the substrate's surface cooperate with one or more of the ferromagnetic layers (24, 28) of the sensor to determine the layers' magnetic properties. Specifically, the thickness of one or more of the sensor's layers can be set above or below a critical thickness which determines whether the easy direction of uniaxial magnetization of a layer of that particular material is fixed or "pinned". If pinned, the layer has a high coercive field. Thus, the new device avoids a biasing layer to pin any of the magnetic layers. Preferably the easy axes of the first two ferromagnetic layers (24, 28) are set at 90° to one another in the zero applied field condition by appropriate choice of layer thickness. A method for manufacturing and several fields of use of the sensor are also disclosed.

21 Claims, 11 Drawing Sheets

MAGNETORESISTIVE SPIN VALVE SENSOR WITH STEPPED LAYERS

The present invention relates generally to magnetoresistive sensors, in particular to magnetoresistive sensors based on the so-called "spin-valve" or "giant magnetoresistive (GMR)" effect. The invention further relates to storage systems incorporating such sensors for reading stored information. The magnetoresistive sensor of the present invention is also applicable to any localized measurement task or problem where a magnetic field is to be detected in a restricted volume or area.

BACKGROUND OF THE INVENTION

The prior art discloses a magnetic read transducer referred to as a magnetoresistive (MR) sensor or head which has been shown to be capable of reading data from a magnetic surface at great linear densities. An MR sensor detects magnetic field signals through the resistance changes of a read element fabricated of a magnetic material as a function of the strength and direction of magnetic flux being sensed by the read element. These prior art MR sensors operate on the basis of the anisotropic magnetoresistive (AMR) effect in which a component of the read element resistance varies as the square of the cosine of the angle between the magnetization and the direction of sense current flow through the element. A more detailed description of the AMR effect can be found in "Memory, Storage, and Related Applications", D. A. Thompson et al., IEEE Trans. Mag. MAG-11, p. 1039 (1975).

More recently, a different, more pronounced magnetoresistive effect has been described in which the change in resistance of a layered magnetic sensor is attributed to the spin-dependent transmission of the conduction electrons between the magnetic layers through a non-magnetic layer and the accompanying spin-dependent scattering of electrons at the layer interfaces and within the ferromagnetic layers. This magnetoresistive effect is variously referred to as the "giant magnetoresistive" (GMR) or "spin valve" effect. Such a magnetoresistive sensor fabricated of the appropriate materials provides improved sensitivity and greater change in resistance than observed in sensors utilizing the AMR effect. In this type of MR sensor, the in-plane resistance between a pair of ferromagnetic layers separated by a non-magnetic layer varies as the cosine (cos) of the angle between the magnetization in the two layers.

U.S. Pat. No. 4,949,039 to Grünberg describes a layered magnetic structure which yields enhanced MR effects caused by antiparallel alignment of the magnetizations in the magnetic layers. Grünberg describes the use of antiferromagnetic-type exchange coupling to obtain the antiparallel alignment in which adjacent layers of ferromagnetic materials are separated by a thin interlayer of Cr or Y.

U.S. Pat. No. 5,206,590 to Dieny et al. discloses an MR sensor in which the resistance between two uncoupled ferromagnetic layers is observed to vary as the cosine of the angle between the magnetizations of the two layers. This mechanism produces a magnetoresistance that is based on the spin valve effect and, for selected combinations of materials, is greater in magnitude than the AMR.

The U.S. Pat. No. 5,159,513 to Dieny et al. discloses an MR sensor based on the above-described effect which includes two thin film layers of ferromagnetic material separated by a thin film layer of a non-magnetic metallic material wherein at least one of the ferromagnetic layers is of cobalt or a cobalt alloy. The magnetization of the one ferromagnetic layer is maintained perpendicular to the magnetization of the other ferromagnetic layer at zero externally applied magnetic field by exchange coupling to an antiferromagnetic layer (element 18 in FIG. 2 of U.S. Pat. No. 5,159 513)

Published European Pat. Application EP-A-0 585 009 discloses a spin valve effect sensor in which an antiferromagnetic layer and an adjacent magnetically soft layer co-operate to fix or pin the magnetization of a ferromagnetic layer. The magnetically soft layer enhances the exchange coupling provided by the antiferromagnetic layer.

The spin valve structures described in the above-cited U.S. patents and European patent application require that the direction of magnetization in one of the two ferromagnetic layers be fixed or "pinned" in a selected orientation such that under non-signal conditions the direction of magnetization in the other ferromagnetic layer, the "free" layer, is oriented either perpendicular to (i.e. at 90° to) or antiparallel to (i.e. at 180° to) the direction of magnetization of the pinned layer. When an external magnetic signal is applied to the sensor, the direction of magnetization in the non-fixed or "free" layer rotates with respect to the direction of magnetization in the pinned layer. The output of the sensor depends on the amount of this rotation. In order to maintain the magnetization orientation in the pinned layer, a means for fixing the direction of the magnetization is required. For example, as described in the above-cited prior art documents, an additional layer of antiferromagnetic material can be formed adjacent to the pinned ferromagnetic layer to provide an exchange coupled bias field and thus pinning. Alternatively, an adjacent magnetically hard layer can be utilized to provide hard bias for the pinned layer.

Another alternative to provide a ferromagnetic layer with a fixed or pinned orientation is described in U.S. Pat. No. 5,301,079 granted to Cain et al. A magnetoresistive read sensor based on the spin valve effect is disclosed in which a sense current flowing in the sensor element generates a bias field which sets the direction of magnetization in each ferromagnetic layer at an equal, but opposite, angle θ with respect to the magnetic easy axis, thus providing an angular separation of 2θ in the absence of an applied magnetic signal. Application to this sensor of the magnetic signal to be sensed results in a further incremental rotation of the direction of magnetization of each ferromagnetic layer, the directions of these two incremental rotations being opposite.

With regard to the above prior art, it is a principal object of the present invention to provide an MR sensor based on the spin valve effect in which neither an antiferromagnetic layer nor hard biasing, nor bias current generating circuitry is required for fixing the magnetization orientation in one or more of the ferromagnetic layers.

SUMMARY OF THE INVENTION

The above-mentioned and other objects and advantages are attained in accordance with the principles of the present invention as set forth in the appended claims.

In accordance with the present invention, the topology of the substrate is such that the substrate's surface consists of regions forming a series of steps or terraces with parallel upper surfaces. These steps may "run" in only one or in more than one direction across the substrate's surface. They may be such that, viewed as a whole, the surface of the substrate slopes in only one, or in more than one direction in relation to the "level" defined by the top of a particular one of the regions. A "miscut" crystalline substrate, which has been cut to have it's upper surface non-parallel to the angularly nearest crystallographic plane, may be used as such a substrate.

A spin valve sensor also in accordance with the present invention can comprise a substrate, the face of said substrate on which the first ferromagnetic layer of the said sensor is mounted having a plurality of steps, whose mean length preferably lies between 10 and 1000 Å (1–100 nm), the thickness of one of the sensor's ferromagnetic layers being such that layer's magnetization direction is pinned. A "pinned" layer is one whose anisotropy favors one direction and which has a high enough coercive field that this direction is not changed under the influence of magnetic fields encountered in use. Preferably, the mean step height is between 1.5 and 30 Å (0.15–3.0 nm).

Also in accordance with the present invention, a spin valve sensor can comprise a substrate, the face of said substrate on which the first ferromagnetic layer of the said sensor is mounted having a plurality of steps, the mean ratio of the step length to the step height of said steps being between 5 and 570, the thickness of one of the sensor's ferromagnetic layers being such that that layer's magnetization direction is pinned.

Further in accordance with the present invention, a spin valve sensor can comprise a crystalline substrate, wherein the face of the substrate on which the layers of the sensor are mounted is not coplanar with any of the crystallographic planes of the substrate, the thickness of one of the sensor's ferromagnetic layers being such that that layer's magnetization direction is pinned. In such a sensor, the face of the crystalline substrate on which the layers of the sensor are mounted advantageously lies in a plane, the normal to which plane makes an angle ($\alpha$) of at least 0.1°, preferably at least 0.5°, to the nearest crystal axis of said crystalline substrate.

The nearest crystal axis referred to above is the axis of the nearest main crystal plane. This plane is the particular one of the crystallographic planes whose normal is closest to the direction of the normal to the plane in which the surface of the crystal lies. As the normals of the main crystal planes, i.e. those denoted by convention with small Miller indices, e.g. smaller than 3 (<100> directions, [1–10], [110], [211], [221], etc.), make angles of at least about 15° to each other, a skilled person can readily determine the nearest crystal plane to a given or desired normal to the face of the substrate.

Substrates whose surfaces have been deliberately cut at a small angle to the direction of the nearest atomic plane of the crystal may be used to obtain a substrate falling within the terms of the present invention. Alternatively, the plurality of steps on the surface of the substrate can be achieved by polishing, epitaxial growth of a buffer layer with a slightly mismatching crystalline structure onto a regular cut substrate, sputtering, and/or suitable doping. These latter techniques are particularly advantageous for the production of substrates with curved surfaces, i.e. non-planar surfaces, and/or for substrates with repeating patterns of steps. Similarly, the layers of the sensor may be produced by sputtering, epitaxial growth or equivalent standard techniques. The substrate may consist of an insulating or a semi-conducting material, and is preferably of silicon.

The sensor of the present invention relies on the properties of layers which are mounted on substrates whose surfaces are stepped or terraced, or have been cut at a small angle to the direction of the nearest crystallographic plane. These properties have been determined by the inventors of the present application and are as follows: The easy direction of uniaxial magnetization (or "easy axis") and the coercive field for a ferromagnetic layer on a terraced substrate depend on the thickness of the ferromagnetic layer. In particular, as the thickness of the ferromagnetic layer, being considered, changes, a critical thickness will be reached where, over a narrow thickness range, the easy direction of uniaxial magnetization will turn through 90° relative to its orientation for thicknesses prior to reaching this critical thickness. Thus the easy direction of uniaxial magnetization of a ferromagnetic layer can be set by ensuring that it has a particular thickness. It has also been found that the coercive field of a ferromagnetic layer changes greatly when the thickness of the layer passes a critical value. Thus it is possible to set the coercivity of a ferromagnetic layer by ensuring that it has a particular thickness. For a given ferromagnetic material, the change by 90° of the easy direction of magnetization and the large change in coercivity occur at well defined critical values of ferromagnetic film thickness. The critical thickness value for the change in the direction of the easy axis of magnetization may not be the same as the critical thickness value for the jump in coercivity.

As an example of the above, a Cobalt layer mounted on a miscut crystalline substrate was found to have a critical thickness in the region of 45 Å (4.5 nm), above which thickness the easy direction of uniaxial magnetization was perpendicular to that shown by layers of lesser thickness than this critical value. Also, the coercivity of a Cobalt layer with thickness greater than 45 Å (4.5 nm) mounted on a miscut substrate is found to be far higher than that of a Cobalt layer of lesser thickness.

The property of high coercivity of a ferromagnetic layer of a particular thickness on a miscut substrate amounts to a fixing or pinning of the easy direction of uniaxial magnetization of the layer. This is equivalent to the pinning discussed earlier in connection with magnetoresistive sensors, however without there being any additional external layer required to bring this about.

The high coercivity and the change in orientation of the easy direction of uniaxial magnetization through 90° can be advantageously employed by constructing two ferromagnetic layers, not necessarily made of the same material, separated by a non-magnetic spacer layer on 'the same substrate, one ferromagnetic layer having a thickness such that it has a high coercivity and a 90° rotation of its easy direction of uniaxial magnetization takes place, the other layer having a thickness such that it has a low coercivity and this rotation does not take place. In other words, the thickness of one of the layers is above the critical thicknesses for pinning and for the 90° rotation of the easy axis, and the thickness of the other layer is below these critical thicknesses. Such an arrangement provides a spin-valve sensor. It is not however necessary for both layers to be made of materials whose magnetic properties depend on thickness. The sensor can consist of one layer whose properties are thickness dependent, and one layer of a different material which constitutes either the free or pinned layer independent of its thickness.

The invention is not restricted to ferromagnetic layers whose coercivity increase and change in easy axis occur above a critical or threshold thickness. A spin-valve sensor can be made from materials where these changes occur for thickness values below a critical thickness. What is important is the possibility of setting the value of coercivity, and in preferred embodiments also the easy direction of uniaxial magnetization, by setting the layers' thicknesses. In particular this leads, through appropriate combinations of layer thickness, to fixing of the direction of magnetization of one of the layers whilst leaving the direction of magnetization of the other layer free to change. A spin-valve sensor according to the invention preferably also has the directions of its easy axes set at an angle of 90° by appropriate choices of layer thickness in order to achieve optimum resistance change of the layers for a given externally applied magnetic field to be sensed.

It is an advantage of the present invention that the spin-valve sensor in accordance with the invention can have two ferromagnetic layers separated by a non-magnetic spacer layer, the pinned ferromagnetic layer needing no additional pinning or biassing layer to fix or "pin" its direction of magnetization. Therefore the sensor according to the invention shows enhanced sensitivity without requiring the fabrication of the extra pinning layer required by prior art spin valve sensors. This results in a device which is smaller and easier to fabricate than known spin valve sensors. The pinned layer may be the ferromagnetic layer closest to the face of the substrate on which the layers lie, in which case the second ferromagnetic layer, i.e. the further of the two layers from the substrate, is the free layer. This arrangement may however be reversed. In a further variant of the invention, a buffer layer may be introduced between the substrate and the first magnetic layer, as to facilitate the deposition or as a protective layer.

The critical thickness values for layers to show the effects of the invention depend on the materials involved and on the topology of the substrate. Therefore the invention is not restricted to ferromagnetic pinned layers with the exact thicknesses of the examples in this description, since these thickness values are only appropriate to one particular film substance and one particular topology. However, a method is given enabling a skilled person to determine the critical thicknesses which mark onset and decay of the pinning effect and the 90° rotation of the easy axis for any combination of ferromagnetic material and substrate topology. Ferromagnets such as Co,Ni,Fe, or alloys of these materials with each other, e.g. permalloy, may be used for the ferromagnetic layers. These materials may further be alloyed with other non-magnetic materials. As already mentioned above, the pinned and free ferromagnetic layers do not have to both consist of the same material.

These and other novel features believed characteristic of the invention are set forth in the appended claims. The invention itself however, as well a preferred mode of use, and further objects and advantages thereof, may be better understood by reference to the following detailed description of illustrative embodiments when read in conjunction with the accompanying drawings.

DESCRIPTION OF THE DRAWINGS

The invention is described in detail below with reference to the following drawings.

For consistency of presentation, FIGS. 3–6,8,11 and 12 have been drawn with the substrate's base and the horizontal of the figure coinciding with the level of the steps in the substrate's surface. However, the invention also encompasses substrates whose bases are parallel to the plane in which the working surface of the crystal has been cut, i.e. substrates whose steps are tilted when viewed in cross-section with the horizontal of the figure coinciding with the substrate's base.

MODE(S) FOR CARRYING OUT THE INVENTION

The GMR or 'spin-valve effect' is based on the fact that the magnetoresistance of a pair of ferromagnetic layers separated by a nonmagnetic spacer layer changes in dependence on the relative orientation of the magnetization vectors in the ferromagnetic layers. The resistance is found to take an extreme value (i.e. maximum or minimum) when the magnetic layers have antiparallel magnetization, and the opposite extreme value when the magnetizations of the layers are aligned parallel. This dependence of the resistance on the magnetization configuration is caused by the inequality of the scattering rates of spin-up and spin-down conduction electrons, be it at the interfaces between the layers or in the bulk.

An optimized sensor based on the GMR effect has its ferromagnetic layers in a single domain state, where the magnetization of one layer (the "pinned" layer) is fixed along a particular direction and the magnetization of the second layer (the "free" layer) can follow easily the magnetic field to be sensed. If used to detect the state of magnetization of a recorded data bit, the free layer changes from more parallel to more antiparallel alignment relative to the pinned layer when sensing successively two oppositely oriented bits. For optimized linear operation of the device with applied field the magnetization of the two layers should be at an angle of 90° to one another as long as no magnetic field to be sensed is present. In the devices of the prior art this is achieved by fixing the magnetization of the pinned layer along its hard magnetization direction typically either by permanent magnets or by exchange coupling to an antiferromagnetic layer, e.g. FeMn.

Figure 1:
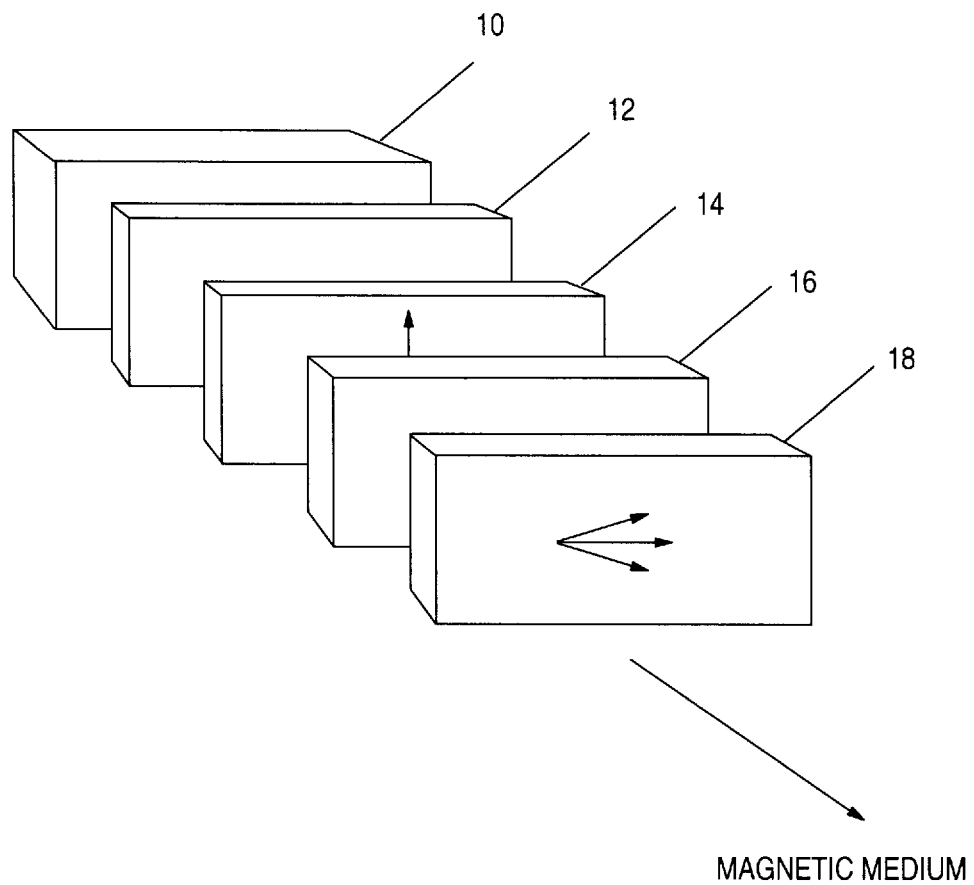
FIG. 1 shows the basic arrangement of a spin-valve sensor as is known from the prior art.

FIG. 1 shows an exploded view of such a prior art spin-valve sensor as known for example from the U.S. Pat. No 5,159,523. However, the layers discussed in, and illustrated in FIG. 2 of U.S. Pat. No. 5,159,523 have been constructed in the reverse order to those shown in prior art FIG. 1 of the present application.

Considering further FIG. 1 of the present application, reference 10 indicates a substrate. Layer 14 mounted on the substrate is a ferromagnetic layer, whose direction of magnetization is indicated by the arrow on its surface. The direction of magnetization of layer 14 is fixed or "pinned" by the provision of an additional layer 12 consisting either of an antiferromagnetic material or of a hard ferromagnetic material.

Layer 16 is a non-magnetic spacer layer. Layer 18 is a further ferromagnetic layer, whose magnetization direction in the absence of a magnetic field to be measured is indicated by the horizontal arrow on its surface. Layer 18 is the free layer. The upwardly and downwardly inclined arrows on layer 18 indicate directions in which the magnetization of the layer may lie under the influence of various externally applied magnetic fields to be measured. Such changes in the direction of magnetization of layer lead, via the spin-valve effect, to changes in the resistance of the group of layers 14,16, 18. This resistance is conventionally measured in the lengthwise direction of the layers, i.e. between the left and right edges of the group of layers in the orientation shown in FIG. 1.

When used to detect the state of magnetization of data points on a magnetic recording medium, the spin-valve sensor of FIG. 1 is positioned such that at least layer 18 is subjected to the magnetic field originating from the data point. The usual direction of movement of the magnetic recording medium is illustrated by the arrow in the foreground of FIG. 1.

Figure 2:
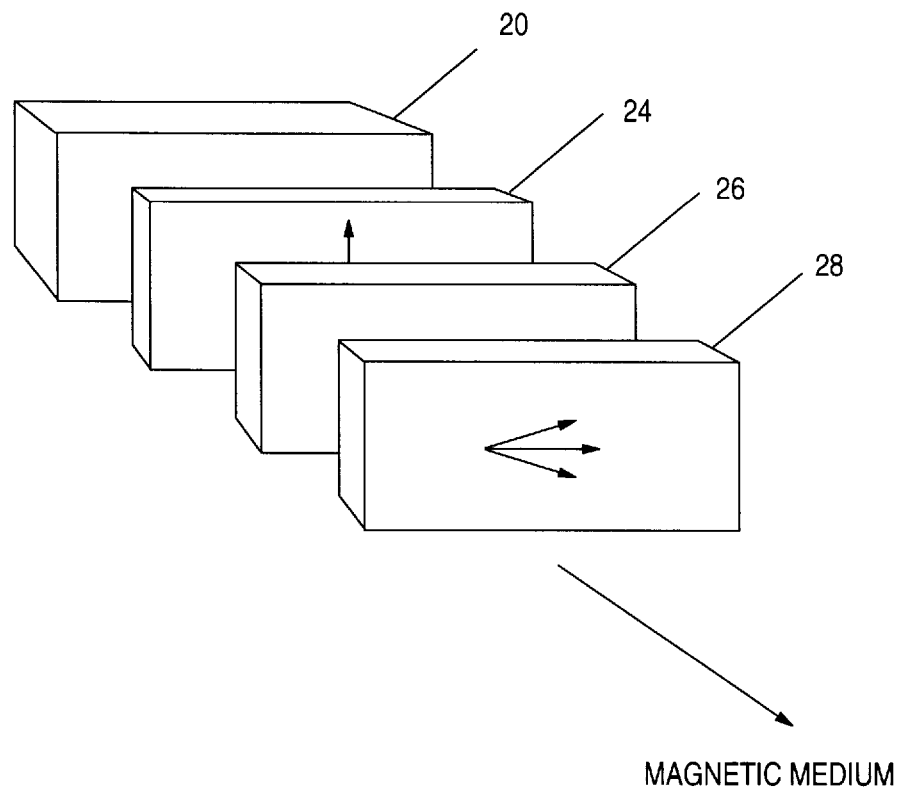
FIG. 2 shows the basic arrangement of the spin-valve sensor according to the present invention.

FIG. 2 shows an exploded view of a sensor according to the invention. The surface of the substrate 20 is terraced and will be described in greater details below. The thickness of one of the ferromagnetic layers, 24 or 28, is greater than the critical thickness necessary for the easy direction of uniaxial magnetization to be pinned. The other ferromagnetic layer has a thickness which is less than this critical thickness, whereby its magnetisation direction can change when there is an externally applied magnetic field. This latter layer therefore constitutes the "free" layer. The thickness of one of the ferromagnetic layers, 24 or 28, should preferably be greater than the critical thickness for its easy direction of uniaxial magnetization to be rotated through 90°, and the other layer should preferably have a thickness which is less than this critical thickness. Therefore the easy axes of the two ferromagnetic layers make an angle of 90° to each other when there is no externally applied magnetic field. This optimizes the output signal from the sensor, but other easy axis orientations are conceivable, e.g. a signal would still be generated if the axes were parallel when there is no externally applied magnetic field to be sensed. Alternatively, one of the layers may be made of a material whose magnetic properties are not thickness dependent.

The principal difference of the arrangement according to the invention and FIG. 2 from the arrangement of prior art FIG. 1 is that the arrangement of the invention does not need a pinning layer 12 to ensure pinning of the direction of magnetization of one of the ferromagnetic layers, 24 or 28. It is the surface structure of substrate 20 in combination with the thicknesses of the ferromagnetic layers which ensures pinning of the magnetization direction of one of the layers, whilst leaving the other layer as the free layer.

A method of determining the critical thicknesses for layers of various ferromagnetic materials is as follows: A number of substrates cut at a particular angle α should be made, as this is the fastest way to produce a terraced surface. Progressively thicker layers of ferromagnetic material should be deposited by any conventional method on different ones of these substrates, and each substrate/layer configuration tested for direction of uniaxial magnetization and coercivity. At some particular value(s) of layer thickness, the easy axis and coercivity will change greatly between one configuration and the next one tested. This detects the critical thicknesses at which the easy direction of uniaxial magnetization rotates through 90° and at which the coercivity rises (or falls) sharply.

If more precise thickness values for these transitions are desired, the experiment can be repeated with another set of substrates, onto which ferromagnetic layers have been formed with thicknesses slightly greater than and slightly less than the critical thicknesses determined from the first "coarse" batch of substrates.

The above method can be repeated for other angles α. It is to be expected that the critical thicknesses or the angles α of cut, or the dimensions of the steps respectively, of the substrate's surface which lead to effective spin-valve sensors may differ from the numerical values given in this application, as different ferromagnetic materials should not be expected to behave identically to the Cobalt example cited in this application. The general applicability of the techniques of the present invention is such that the skilled person would expect to investigate the suitability of various materials and arrangements before settling on one particular combination of layer thicknesses, angle of substrate surface cut and layer sequence to form a sensor for a particular use. All such investigations form part of the scope and applicability of the present invention, as this invention opens up a wide field of possible sensor arrangements, simplified with respect to prior art sensors.

The largest angle of miscut of substrate for which the effects of the invention have been checked is 6.0°. See example IV at the end of this description. However, it is to be expected that the effects of the invention will be observed up to miscuts of at east approx. 10° based on the consistency of the effects observed in the range up to and including 6.0°.

Figure 3:
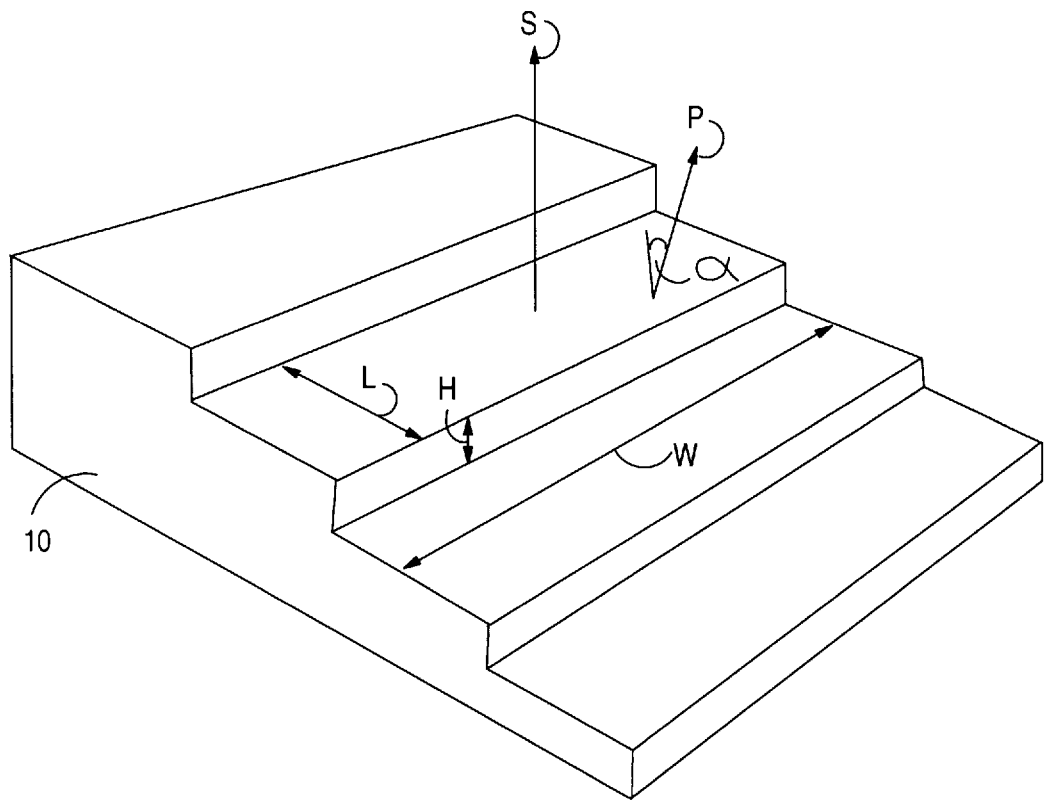
FIGS. 3–4 show substrates in accordance with the invention in three dimensional view.

FIGS. 3–12 are schematic representations of substrates which lead to the effects of the invention and which can be used as the substrate in the arrangement of FIG. 2. FIGS. 3–12 are enlargements which are not drawn to scale in all dimensions. The sequence of pinned ferromagnetic, non-magnetic and free ferromagnetic layers of a spin-valve sensor is to be mounted onto these substrates. In FIG. 3, the regions of atoms on the substrate's surface take the form of steps or terraces. The upper surface of each step comprises one of the layers of atoms of the crystalline material of which the substrate is made. A crystalline substrate has been illustrated, which has the upper surfaces of its four steps parallel to one another. The steps' upper surfaces consist of regions of parallel planes of the crystal's atoms. The arrow labelled S indicates the direction of the normal to the upper surface of a step. The arrow labelled P indicates the direction of the normal to the plane in which the crystal's surface has been cut. The angle between the directions indicated by arrows S and P is the angle of miscut of the surface of the substrate or generally the inclination or slope angle of the terraced surface, α. An angle a of between 0.1° and 10° is believed to result in pinning along the required direction of an overlying ferromagnetic layer of a particular range of thicknesses, and thus to lead to the effects of the present invention. As explained in example II at the end of this description, for a test sensor the range of thicknesses 45–900 Å (4.5–90 nm) was found to be suitable for the pinned layer when this consisted of Co and the copper substrate had a inclination angle α of 1.6°. A further sensor was constructed with a miscut angle α of 1.9°, see example III. A slightly lower minimum pinned layer thickness appeared to work with a substrate miscut at 1.9°.

The dimension L indicated on the figures denotes the length of an individual step. Likewise, the dimension H indicates the height of an individual step. The dimension W illustrates only the width of the particular section of substrate illustrated, and can generally be interpreted as showing the width direction. Although the steps illustrated in FIG. 3 have been shown to be approximately equal in length, it is believed that the effects of the invention are achieved by any group of steps whose mean length lies within the range of 10–1000 Å (1–100 nm). Measurement of the sensor's resistance can either be made in any direction parallel to the plane of the layers, which is preferred, or in a direction perpendicular to the plane of the layers, which may give an improved signal but be harder to implement.

Figure 4:
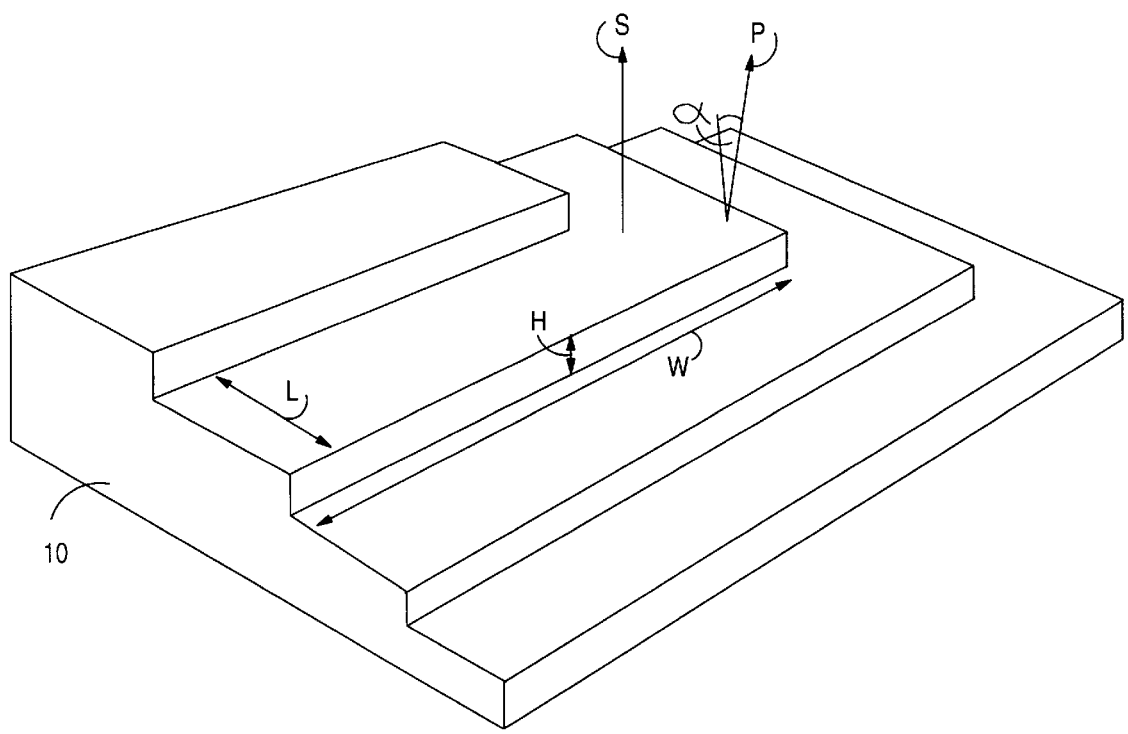

FIG. 4 illustrates a substrate where the steps "run" in more than one direction across the surface. This results from a miscut of the crystal such that the substrate's surface lies in a plane whose line of intersection with the upper surface of the steps does not run parallel to any of the step edges shown in FIGS. 3 or 4. In this case, the section of substrate surface shown in FIG. 4 will be repeated in the "into the paper" direction.

The various regions shown in FIGS. 3–12 consist of planes of atoms which differ from one another in height by one or more atomic thicknesses or "monolayers". The substrates shown in FIGS. 3–12 induce pinning on overlying ferromagnetic layers of appropriate thickness, provided that the mean length L of the steps on the whole surface is between 10 and 1000 Å A (1 and 100 nm respectively), or that the mean ratio of the step length to step height is between 5 and 570. The steps may be of equal length, but do not have to be. Typical step heights H are in the range of 1.5–30 Å (0.15–3.0 nm). The angle of miscut of the crystal which will give rise to the effects of the invention is believed to extend between 0.10 and 100. The angle is however preferably at least 0.5°. For a substrate miscut at 0.5° the mean step length is approximately 200 Å (20 nm) and the mean ratio of step length to step height is approximately 110. For a substrate miscut at 6.0° the mean step length is approximately 17 Å (1.7 nm), and the mean ratio of step length to step height is approximately 10.

Figure 5:
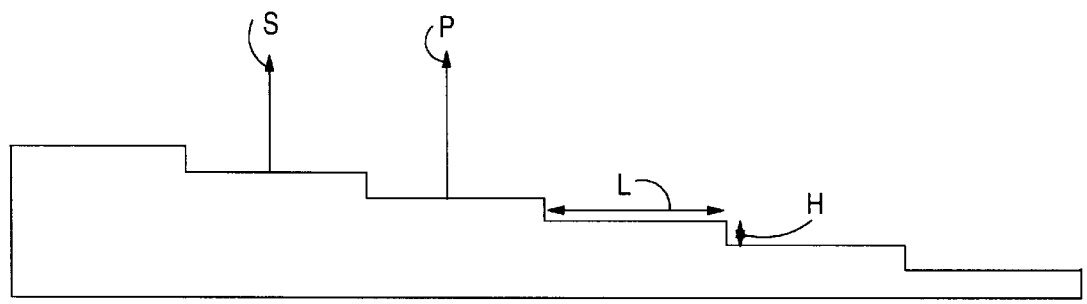
FIGS. 5–12 show substrates in accordance with the invention in cross-section.

In order to illustrate further topographical arrangements of substrate surfaces which may be employed to achieve the effects underlying the invention, reference is made to FIGS. 5–12. FIGS. 5–12 show cross-sections of substrates. Each step height shown represents one or more layers of atoms. The steps are shown as being "sharp" in this illustration: in reality they are rounded or less regular due to the discrete nature of the atoms of which they are made. The aspects of the substrates of FIGS. 5–12 which are of particular relevance to the invention are:

FIG. 5: Steps of equal length.

Figure 6:
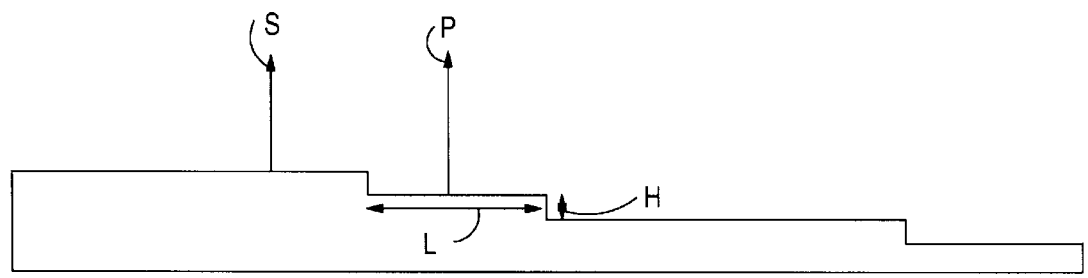

FIG. 6: Steps of unequal length.

Figure 7:
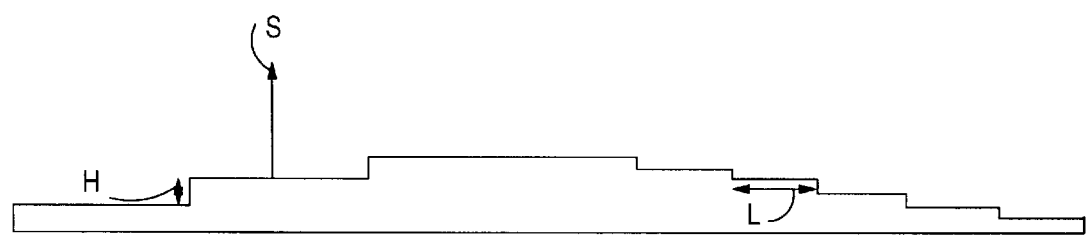

FIG. 7: Slopes in two opposed directions away from a central peak three dimensional view.

Figure 8:
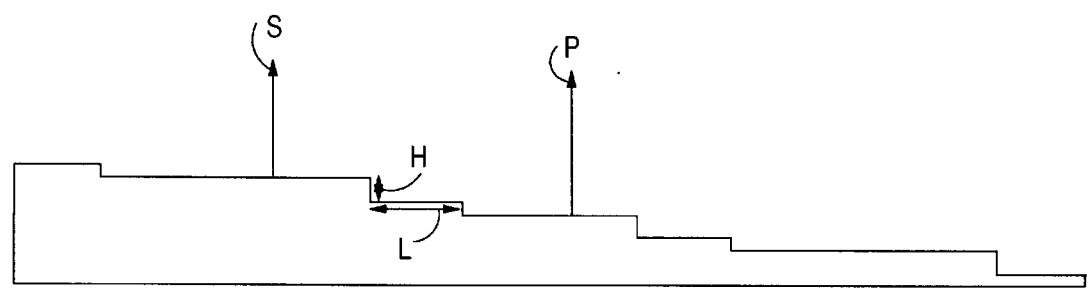

FIG. 8: Steps of unequal heights and unequal lengths.

Figure 9:
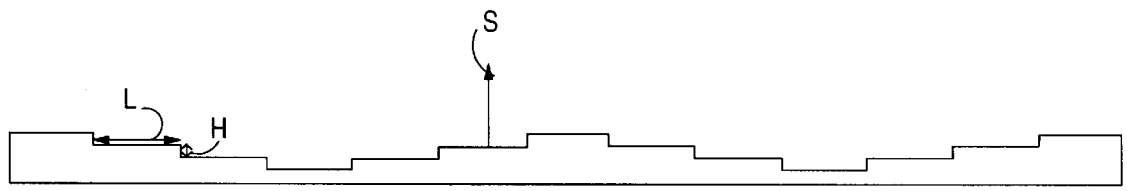
Figure 12:
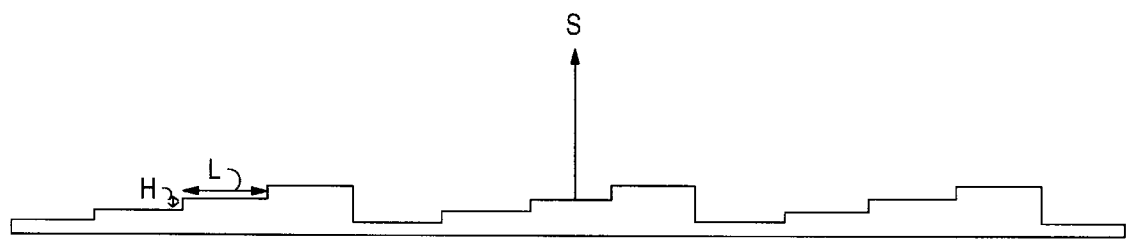

FIGS. 9 and 12: No net slope, but a repeating pattern of steps.

Figure 10:
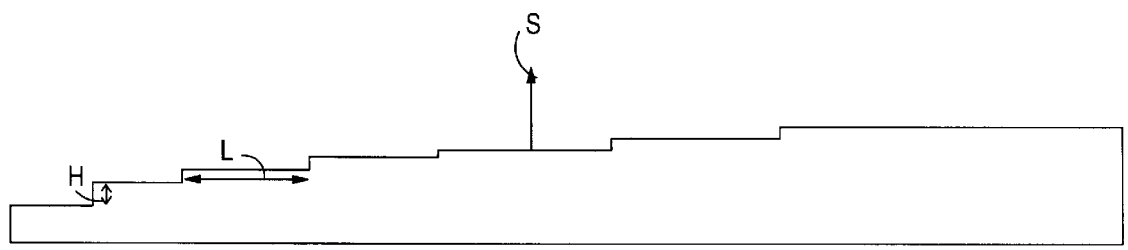

FIG. 10 A variable gradient miscut, i.e. no single plane of miscut but a curved upper surface.

Figure 11:
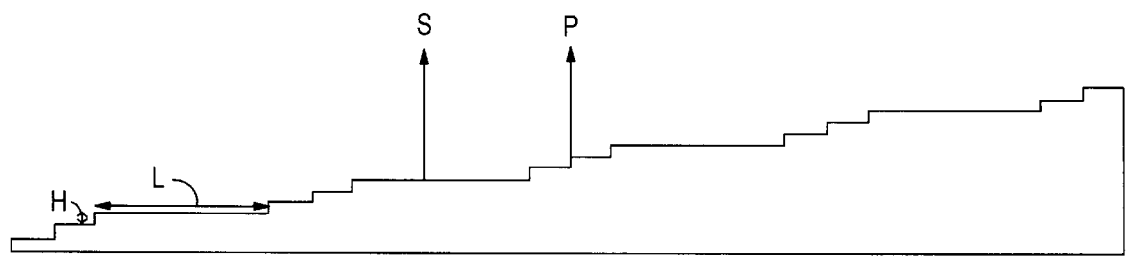

FIG. 11: Repeating pattern of unequal step length.

The geometry of each of FIGS. 5–12 may be repeated in the substrate surface direction not shown in the figure, i.e. in the "into the page" direction. Alternatively, the surface profile of the substrate in the "into the page" direction may take the form of that shown in any other of FIGS. 5–12, in so far as substrate manufacturing techniques permit and provided that the symmetry of the arrangement remains at most two-fold, particularly not four-fold, such that one preferred magnetization direction can be obtained and fixed. Substrates according to the invention may fall within the terms of one or more of the appended independent claims, e.g. the substrate of FIG. 10 does not have a single plane as defined in claim 4 because the surface's substrate is curved, but may be constructed with steps according to either of the appended claims.

The layers of the sensor may be constructed in the opposite order to that shown in the generalized spin-valve sensor of FIG. 2, i.e. the pinned layer may be furthest from the substrate with the free layer lying between the substrate and the pinned layer. The pinned layer remains pinned in this configuration provided that its thickness is within the range necessary for pinning although the free and non-magnetic layers lie between it and the substrate. Furthermore, the free layer remains free and is not subject to pinning provided that its thickness is not within the range necessary for pinning. The free layer in example II at the end of this description must have its thickness below the critical thickness which marks the onset of pinning.

For similar reasons, a sensor may be constructed consisting, in order, of a substrate/pinned layer/non-magnetic layer/free layer/spacer/pinned layer/non-magnetic layer/free layer . . . etc., provided again that the thicknesses of the free and pinned layers used lie respectively below and within the ranges necessary for pinning to occur, and that a non-magnetic spacer layer is provided between any free layer and adjacent pinned layer. Likewise the order substrate/free layer/non-magnetic layer/pinned layer/spacer/free layer/non-magnetic layer/pinned layer/spacer etc. could be used, or substrate/pinned layer/non-magnetic layer/free layer/spacer layer/free layer/non-magnetic layer/pinned layer etc. Additional buffer layers may be introduced whenever appropriate.

In particular, it is regarded as being well within the scope of the invention for the substrate to be covered by an additional buffer layer before any of the ferromagnetic or nonmagnetic layers 14–18 as shown in FIG. 2 are deposited. Such a buffer layer becomes for example important when a mismatch in the crystal structure of the buffer layer and the (original) substrate is exploited to fabricate a surface with steps—a method which is described in the MRS Bulletin, June 1991, pp. 30—33 by C. P. Flynn. Additional shielding layers may also be provided by similar techniques.

The sensor of the present invention is particularly suitable to form the magnetic transducer in a magnetic storage system such as a hard disk drive or similar device. The transducer reads the state of magnetization of the magnetic recording medium, which moves close to the transducer in a plane perpendicular to, or at more than 80° to, the plane in which the layers of the sensor lie.

A sensor according to the present invention may be used to detect the presence of, or to measure, a magnetic field. In particular, the sensor may be constructed in a variety of sizes and can be expected to be especially suited to detect the presence of, or for the measurement of, magnetic fields of 0.001–100 Oe (0.00008–8.0 kA/m). As the sensor can be made very small, it is also particularly suited to the measurement and detection of magnetic fields which are of limited spatial extent, or which exist in regions to which there is only limited access. Fields of use can thus be found in earth exploration like mining an oil drilling, or to measure small magnetic fields produced by the human body.

EXAMPLE I

A test structure in accordance with the invention consists of two Co layers separated by a nonmagnetic Cu spacer layer. A very small miscut of the nominally (100) oriented Cu substrate induces a large uniaxial magnetic anisotropy in the Co film.

Considering test structures of progressively increasing thickness, at a certain thickness $d_c$ the Co film abruptly switches its easy magnetization direction by 90° to a direction in which the orientation remains, even under the application of external magnetic fields of the magnitude to be detected by a spin valve sensor in use. The Co film has thus been pinned and has shown a rotation of 90° of its easy axis. For films with a thickness $d > d_c$ the coercive field is enhanced by more than a factor of two as compared to the thinner films. Therefore a sensor according to the present invention can have as a pinned layer a uniaxial Co film with $d>d_c$, a Cu spacer layer thick enough to show only very small coupling, and a free sensing layer.

In use as a detector of the state of magnetization of a data point on a magnetic storage medium, the free Co layer switches in the stray field of the written bits and hence induces the GMR effect by changing from more parallel to more antiparallel alignment with the pinned Co layer.

In the above described test structure the sensing layer is a thin Co layer, but soft magnetic layers such as permalloy layers might be preferable. The miscut of the substrate, i.e. the cutting of the upper surface of the substrate such that that surface lies in a plane which does not coincide with a unique plane of the crystal's atoms, gives rise to the aforementioned "regions" on the crystal's surface.

EXAMPLE II

Figure 13:
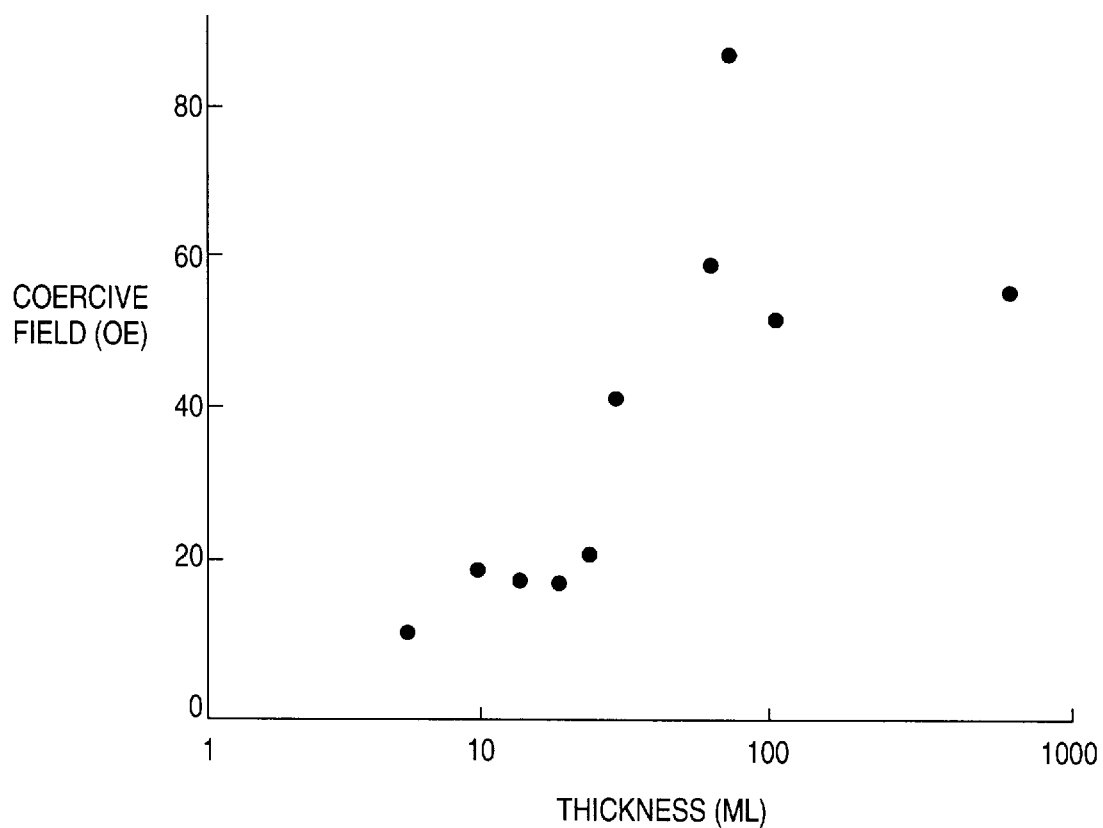
FIG. 13 shows the coercive field of a ferromagnetic layer, illustrating the pinning strength of the layer.
Figure 14A:
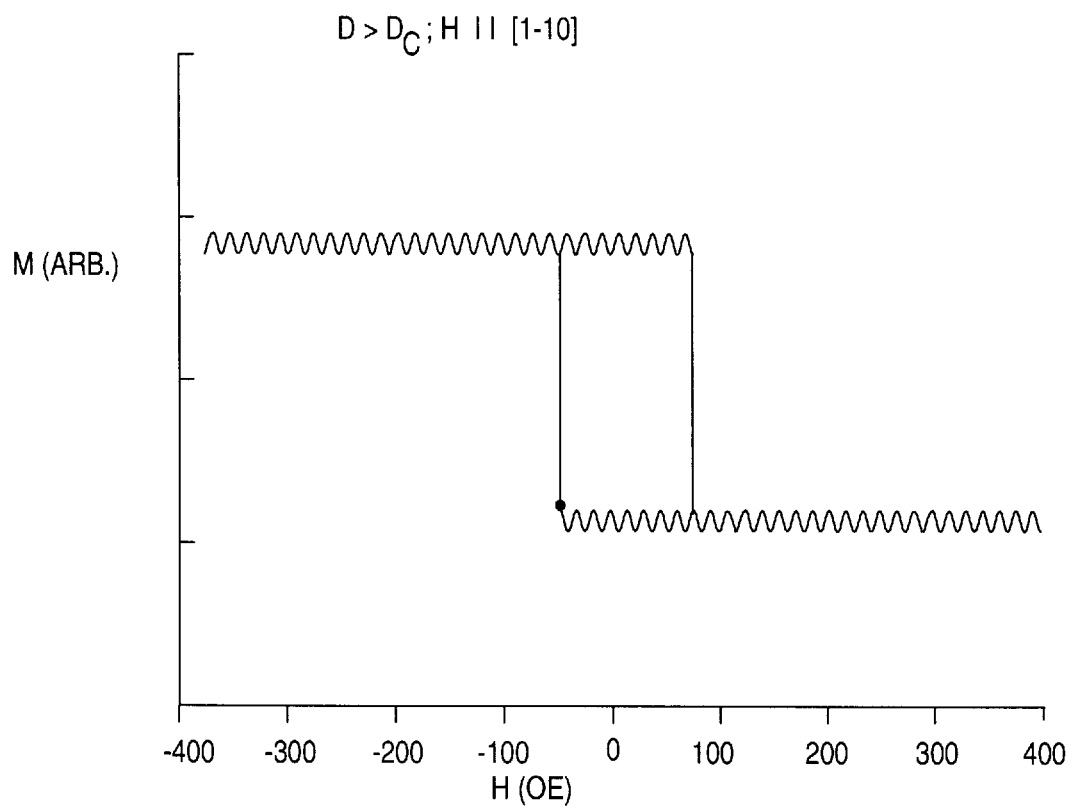
FIGS. 14 A–C show hysteresis loops of a free layer and of a ferromagnetic layer which has been pinned in accordance with the invention.
Figure 14B:
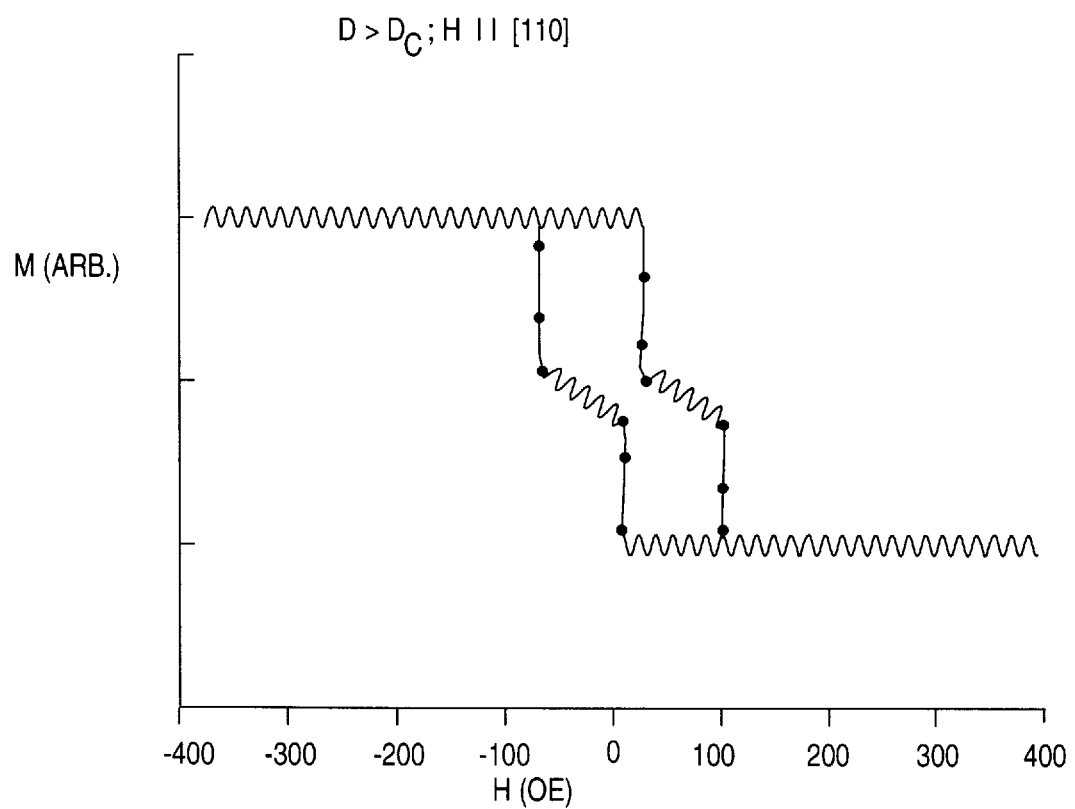
Figure 14C:
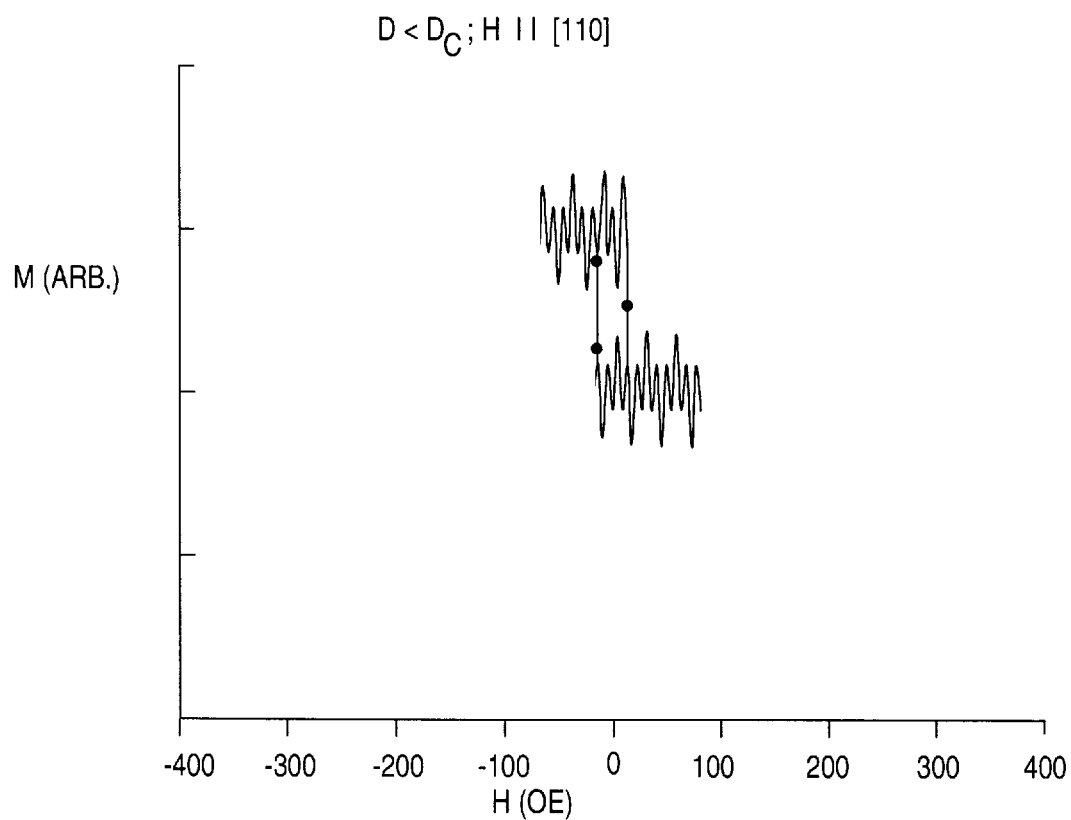

Films of various thicknesses were grown on top of Cu<100> single crystals, miscut by 1.6° essentially along the in-plane [110] direction. This provoked a large uniaxial surface anisotropy, preferring the [1–10] direction over the [110] direction (which are equivalent on a perfectly oriented <100> substrate) for thin films. At a thickness of $d_c \approx 45$–54 Å (4.5–5.4 nm) the easy magnetization direction switched discontinuously from the [1–10] to the [110] direction and stayed along this direction for films as thick as 900 Å (90 nm). The important parameter for a working sensor device is the coercive field, reported in FIG. 13. The essential fact is that the coercivity for films with $d>d_c$ is high, of the order of 50 to 100 Oe (4–8 kA/m), and hence these films keep their magnetization aligned along the [110] direction even in the external fields to be sensed. Typical hysteresis loops as observed by the magnetooptic Kerr effect are shown in FIG. 14. Along the [110] direction the thick film shows a rectangular loop with remanence equal to the saturation characteristic of an easy direction (FIG. 14A), whereas along the [1–10] direction the loop indicates the existence of an intermediate axis (FIG. 14B). For comparison, the hysteresis along the [1–10] direction for a thin film d=9 Å<$d_c$) (=0.9 nm<$d_c$) shows the switched easy axis (FIG. 14C). The hysteresis loops thus contain the information necessary to determine easy axis and coercivity of a particular film. Applying this method to the films of various thicknesses provides a means to determine the values of the critical thicknesses for a particular film and a particular substrate.

The substrate miscut of 1.6° results in a mean step length of approximately 64 Å (6.4 nm) and a mean step length to step height ratio of 35. The observation that a switching of the magnetization direction at large thickness occurs must be attributed to a large surface anisotropy. The observation that films as thick as 900 Å (90 nm) show uniaxial behaviour proves that bulk anisotropies are responsible for the [110] easy direction in the thick film. Both these anisotropies cannot be identified with the anisotropies observed on <100> surfaces simply projected onto the miscut surface, since the miscut angle is much too small to explain the dramatic anisotropy change from the fourfold-symmetric <100> surface to the twofold symmetry on the miscut <100> surface.

Figure 15A:
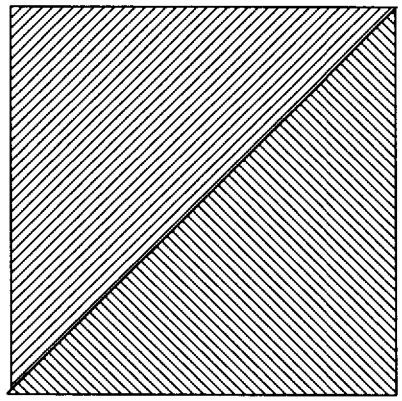
FIGS. 15 A–B show magnetization images of the free and pinned layers of a spin-valve sensor.
Figure 15B:
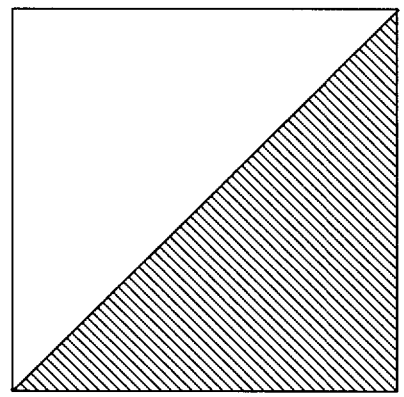

A working device consists of a thick pinned Co layer, a nonmagnetic spacer, and a free sensing layer. As a first step a thin Co layer as described above was taken as the free layer, and a Cu layer as the spacer. In this configuration it was verified that the observations on the single Co film are reproduced; i.e. the magnetic properties of a Co layer are not changed by growing it as part of a layered Co/Cu/Co/Cu<100> sample. FIG. 15A shows a magnetization image of a sample with Co14/Cu180/Co90/Cu<100> (non-bracketed numbers indicate thickness in Angstroms, respectively 1.4 nm, 18 nm and 9 nm) exposing the free layer on the upper part of the image, and for comparison the pinned layer on the lower part. The magnetization directions of the free and pinned Co layers in this Co/Cu/Co/Cu<100> structure are the same as for Co layers of the same thicknesses mounted singly on a Cu substrate and circumscribe an angle of 90°. Application of a magnetic field larger than the coercive field of the free layer switches the free layer, with no influence on the pinned layer, see FIG. 15B. Both layers remain in a single domain state. The thickness values given above are only for a Co film as the pinned layer.

EXAMPLE III

A similar sample to that in example II was made with the substrate's surface deliberately cut at an angle of 1.9° to the nearest plane of atoms. A ferromagnetic layer mounted on this substrate was found to have its direction of magnetization pinned. The mean length of the steps on the substrate's surface corresponding to a miscut of 1.90 is approximately 54 Å (5.4 nm). The corresponding mean ratio of step length to step height is approximately 30.

EXAMPLE IV

Another similar sample to example II was made with the substrate's surface cut at an angle of 6.0° to the nearest plane of atoms. A ferromagnetic layer mounted on this substrate was found to have its direction of magnetization pinned. The mean length of the steps on the substrate's surface corresponding to a miscut of 6.0° is approximately 17 Å (1.7 nm). The corresponding mean ratio of step length to step height is approximately 10.

EXAMPLE V

In the test sensors described previously, copper was used as the substrate. For a magnetoresistive head the metallic single crystalline Cu<100> substrate has to be replaced by an insulating or semiconducting material. It has been shown before that Si<100)> serves this purpose. In fact it has even been shown that Co/Cu/Si<100> grows epitaxially. II was verified that Cu grows in large terraces (several hundred Å (several tens of nm)) on top of Si<100> in epitaxial <100> orientation, after the Cu-silicide formation stops. Therefore the uniaxial behavior of the Co films on top of a miscut Cu<100> single crystal is also present if grown on miscut Si<100> wafers covered by a Cu<100> film. The sensor according to the invention may therefore have a thin buffer layer, e.g. of copper, immediately above the substrate, onto which the layers of the sensor are then mounted. Recently it has been shown that thin epitaxial films can be grown also by sputtering onto oriented substrates. In particular, Co/Cu<100> can be sputtered onto MgO(100). Therefore the invention is also applicable to sputtered samples grown onto miscut substrates.

The free layer of a GMR head must have a small coercive field, to allow the rotation of the magnetization direction easily in very small fields. The free Co film of the above structure has not been optimized in that respect. In particular the invention is not restricted to Co layers. The thin Co layer simply shows that a thin magnetic film grown on a miscut surface is uniaxial. A thin permalloy layer could be selected to do the same but with smaller anisotropy. The advantage with a permalloy layer is that there the easy magnetization axis can be tailored easily according to the needs by e.g. varying sputtering pressure or applying magnetic fields during deposition.

We claim:

1. A spin valve sensor comprising a substrate (20), the face of said substrate on which at least two ferromagnetic layers (24, 28) are mounted having a plurality of steps whose mean step height (H) is between 1.5 and 30 Å (0.15–3.0 nm) and/or whose mean step length is between 10 and 1000 Å (1–100 nm), the thickness of one of the sensor's ferromagnetic layers (24,28) being such that said one layer's magnetization is pinned.

2. A spin valve sensor comprising a substrate (20), the face of said substrate on which at least two ferromagnetic layers (24, 28) are mounted having a plurality of steps wherein the mean ratio of the step length (L) to the step height (H) of said steps is between 5 and 570 and the thickness of one of the sensor's ferromagnetic layers (24, 28) being such that said one layer's magnetization is pinned.

3. The sensor of claim 1, wherein the substrate is a crystalline substrate, wherein the face of the substrate on which at least two ferromagnetic layers are mounted is not coplanar with any of the main crystallographic planes of the substrate, the thickness of one of said ferromagnetic layers being such that said one layer's magnetization direction is pinned.

4. The sensor of claim 3, wherein the face of a crystalline substrate on which the ferromagnetic layers are mounted lies in a plane, the normal to which plane makes an angle ($\alpha$) of at least 0.1°, preferably at least 0.5°, to the nearest crystal axis of said crystalline substrate.

5. The sensor of claim 1, wherein the thickness of the first ferromagnetic layer of the spin-valve sensor is greater than or equal to the minimum thickness required for said first layer to have its direction of magnetization pinned, and the thickness of the second ferromagnetic layer is less than the minimum thickness required for said second layer to have its direction of magnetization pinned.

6. The sensor of claim 1, wherein the thickness of the second ferromagnetic layer of the spin-valve sensor is greater than or equal to the minimum thickness required for said second layer to have its direction of magnetization pinned, and the thickness of the first ferromagnetic layer is less than the minimum thickness required for said first layer to have its direction of magnetization pinned.

7. The sensor of claim 1, wherein the thickness of the first ferromagnetic layer of the spin-valve sensor is greater than the maximum thickness for which said first layer's direction of magnetization is pinned, said first ferromagnetic layer thus forming a free layer, and the thickness of the second ferromagnetic layer is less than or equal to the maximum thickness for which said second layer's direction of magnetization is pinned.

8. The sensor of claim 1, wherein the thickness of the second ferromagnetic layer of the spin-valve sensor is greater than the maximum thickness for which said second layer's direction of magnetization is pinned, the second ferromagnetic layer thus forming a free layer, and the thickness of the first ferromagnetic layer is less than or equal to the maximum thickness for which said first layer's direction of magnetization is pinned.

9. The sensor of claim 1, wherein the thicknesses of the ferromagnetic layers of the spin-valve sensor are such that the direction of the easy axis of one of said layers makes an angle of about 90° to the direction of the easy axis of the other layer.

10. The sensor of claim 1, wherein one of the ferromagnetic layers of the sensor is made of a material whose magnetic properties are not dependent on said one layer's thickness.

11. The sensor of claim 1, wherein the face of the substrate comprises a plurality of flat regions, each flat region consisting of an exposed layer of atoms of said substrate.

12. The sensor of claim 11, wherein the exposed layer of atoms of the substrate lie in parallel planes.

13. The sensor of claim 3, wherein the crystalline substrate is monocrystalline.

14. The sensor of claim 1, wherein the steps run in more than one direction across the surface of the substrate.

15. The sensor of claim 1, wherein the ferromagnetic layers of the sensor comprise or consist of either cobalt, nickel, iron or permalloy.

16. The sensor of claim 1, wherein the ferromagnetic layers of the sensor comprise or consist of cobalt, nickel or iron alloyed with each other and/or with other non-magnetic materials.

17. The sensor of claim 15 or claim 16, wherein the pinned ferromagnetic layer and the free ferromagnetic layer of the sensor comprise or consist of different materials.

18. The sensor of claim 1, wherein a layer of nonmagnetic material between both ferromagnetic layers in the sensor comprises or consists of copper.

19. The sensor of claim 1 or claim 4 or claim 13, wherein the substrate comprises or consists of an insulating or semi-conducting material, preferably silicon.

20. The sensor of claim 1, wherein the substrate has an additional buffer layer on the surface, onto which buffer layer the first ferromagnetic layer is mounted.

21. The sensor of claim 20, wherein the buffer layer comprises or consists of copper.

* * * * *